(12) United States Patent
Shepard

(10) Patent No.: US 9,195,540 B2
(45) Date of Patent: Nov. 24, 2015

(54) MULTIPLE SECTOR PARALLEL ACCESS MEMORY ARRAY WITH ERROR CORRECTION

(75) Inventor: Daniel R. Shepard, North Hamtpon, NH (US)

(73) Assignee: HGST, INC., San Jose, CA (US)

(*) Notice: Subject to any disclaimer, the term of this patent is extended or adjusted under 35 U.S.C. 154(b) by 0 days.

(21) Appl. No.: 13/200,909

(22) Filed: Oct. 4, 2011

(65) Prior Publication Data

US 2012/0096331 A1  Apr. 19, 2012

Related U.S. Application Data

(60) Provisional application No. 61/404,625, filed on Oct. 6, 2010.

(51) Int. Cl.
| | |
|---|---|
| G11C 29/00 | (2006.01) |
| G11C 29/52 | (2006.01) |
| G11C 29/04 | (2006.01) |
| G06F 11/10 | (2006.01) |
| G11C 11/56 | (2006.01) |

(52) U.S. Cl.
CPC ............ *G06F 11/1072* (2013.01); *G11C 11/56* (2013.01); *G11C 2029/0411* (2013.01)

(58) Field of Classification Search
None
See application file for complete search history.

(56) References Cited

U.S. PATENT DOCUMENTS

| | | | | |
|---|---|---|---|---|
| 5,754,566 | A | * | 5/1998 | Christopherson et al. ..... 714/773 |
| 5,822,245 | A | * | 10/1998 | Gupta et al. ............. 365/185.12 |
| 7,149,934 | B2 | * | 12/2006 | Shepard ......................... 714/48 |
| 7,493,457 | B2 | * | 2/2009 | Murin .......................... 711/157 |
| 2003/0041299 | A1 | * | 2/2003 | Kanazawa et al. ............ 714/766 |
| 2005/0086574 | A1 | * | 4/2005 | Fackenthal ................... 714/766 |
| 2009/0222701 | A1 | * | 9/2009 | Song et al. ................... 714/704 |
| 2010/0318877 | A1 | * | 12/2010 | Amato et al. ................. 714/755 |
| 2011/0302469 | A1 | * | 12/2011 | Komai ......................... 714/718 |
| 2012/0144273 | A1 | * | 6/2012 | Uchikawa et al. ............ 714/773 |

OTHER PUBLICATIONS

Tanenbaum, Andrew S., Structured Computer Organization, 2nd Ed, Prentice-Hall, Inc., 1984, pp. 10-11.*

* cited by examiner

*Primary Examiner* — Justin R Knapp
(74) *Attorney, Agent, or Firm* — Patterson & Sheridan, LLP

(57) ABSTRACT

The present invention is a method for accessing more than one block of correctable information at a time when it is most efficient to access more bits of information at a time on a given dimension, for example from a multiple bit per cell (MLC) memory element, than the error correction algorithm can correct. Since it may be more efficient to access more bits of information at a time on a given dimension than the error correction algorithm can correct, that access is performed in this most efficient way, but the information is divided into correctable blocks within this information such that the error correction algorithm can still compensate for a serious fault along a given dimension. Furthermore, the present invention can be employed even when the number of bits retrieved along a given dimension is less than the number of correctable bits when it is desired to protect against a given number of faults which could, in total, exceed the number of correctable bits.

18 Claims, 4 Drawing Sheets

MULTIPLE SECTOR PARALLEL ACCESS MEMORY ARRAY WITH ERROR CORRECTION

CROSS REFERENCE TO RELATED APPLICATIONS

This application claims priority to and benefit of U.S. Provisional Patent Application Ser. No. 61/404,625, filed on Oct. 6, 2010, which is incorporated herein by reference.

FIELD OF THE INVENTION

The present invention relates to semiconductor storage devices, and more particularly to semiconductor storage devices which utilize error correction and which access multiple bits of information in a third or greater dimension.

REFERENCE TO A SEQUENCE LISTING, A TABLE, OR A COMPUTER PROGRAM LISTING COMPACT DISK APPENDIX

Not Applicable.

REFERENCE REGARDING FEDERAL SPONSORSHIP

Not Applicable.

STATEMENT REGARDING FEDERALLY SPONSORED RESEARCH OR DEVELOPMENT

Not Applicable.

SUMMARY OF THE INVENTION

Memory devices often store a single bit of binary information in a given memory cell. This information is typically stored as a logic state in RAM or as trapped charge in Flash memory or as a molecular arrangement corresponding to a given level of conductivity is phase change memory (PCM) or resistive change memory or as a given chemical concentration (e.g., oxygen) in capacitive memory. Some memory types are volatile and some are non-volatile. In an effort to increase memory density, some technologies have stored more than two states corresponding to more than one binary bit; in Flash memory multi-level cell devices (MLC), different amounts of charge are trapped in a floating gate in order to indicate and store multiple states corresponding to two or more binary bits. In some designs, analog information has been stored. With phase change memory, a Chalcogenide alloy can be set to either an amorphous state or a crystalline state (high resistance and low resistance, respectively) to retain one binary bit or, to retain more than one binary bit per cell, can be set to an intermediate value. It is desirable to have a memory cell that can store more than one binary bit per cell and that can be programmed quickly. In three dimensional (3-D) memory, multiple layers can be addressed together resulting in multiple bits of data per addressed location. Memories can be divided into tiles that can be accessed in parallel resulting in multiple bits of data per accessed location. In some systems, multiple memory chips can be accessed in parallel resulting in multiple bits of data per accessed address. Storage can even be distributed across networks and the world wide web for more parallel access and in multiple bits of data per access. In all of these cases, error correction can be used to correct for any defective element within a given dimension. U.S. Pat. No. 7,149,934 issued on Dec. 12, 2006 by Shepard and titled "Error Correcting Memory Access Means and Method" discloses error correction optimization techniques for defective rows (first dimension) and columns (second dimension). In this patent, a means and method is disclosed for including no more bits from a given multiple bit per cell memory element than can be corrected by the error correcting algorithm employed.

Prior art designs, as depicted in FIG. 1, comprising flash memory will access (read or write) memory cells by moving the information between those memory cells and a buffer 102. This buffer 102 can be incorporated within the flash memory chip, can be incorporated into a companion controller chip, or both. These buffers can be designed to hold one or more correctable segments of information (often called a sector or block). Typically, information 105 in the buffer 102 is processed to compute error correcting bits 104 that are then stored 108 in the memory array along with the data or, when retrieving data 105 from the memory array, the information in the buffer 106, including the error correcting bits 104, is processed to compute what data bits are erroneous and to then correct those bad bits (up to the limit on the number of correctable bits as a function of the error correcting algorithm employed and the number of error correcting bits included). When such processing is done with MLC flash memory, the plurality of bits 103 transferred between the MLC memory cell 101 and the buffer 102 is done in order; that is to say, the plurality of bits 103 stored in a given MLC memory 101 cell are positioned in the buffer 102 all together. However, as disclosed in U.S. Pat. No. 7,149,934, doing so increases the likelihood that a segment of data might fail to be correctable because if a given MLC memory cell is defective, all of the bits corresponding to that memory cell would fail simultaneously and could cause the limit on the number of correctable bits (as a function of the error correcting algorithm employed and the number of error correcting bits included) to be exceeded.

The present invention is a method of accessing more than one block of correctable information at a time when it is most efficient to access more bits of information at a time on a given dimension than the error correction algorithm can correct. Since it may be more efficient to access more bits of information at a time on a given dimension than the error correction algorithm can correct, that access is performed in this most efficient way, but the information is divided into correctable blocks within this information such that the error correction algorithm can still compensate for a serious fault along a given dimension. Furthermore, the present invention can be employed even when the number of bits retrieved along a given dimension is less than the number of correctable bits when it is desired to protect against a given number of faults which could, in total, exceed the number of correctable bits.

DESCRIPTION OF THE PREFERRED EMBODIMENT

The present invention is a means to access information in a way that is most efficient while dividing that information into a plurality of correctable blocks such that the error correction algorithm can still compensate for a serious fault along a given dimension. Many current memory storage technologies available at the time of this writing (and new technologies in development or yet to be invented) can be used to store more than one data bit (corresponding to two stored states of the technology) in a given memory cell. With multi-level cell (MLC) flash memory, charge is trapped on a floating gate with varying levels of charge corresponding to various stored states those states correspond to one or more data bits of information. With phase change memory and resistive change memory, the resistance of the storage element is set by the application of a voltage across or a current through the element whereby varying levels of resistance correspond to various stored states those states correspond to one or more binary data bits of information. Capacitive memory, wherein the capacitance is set by causing atoms (such as oxygen) to migrate within the dielectric gap between two contacts thereby changing the dielectric constant and the capacitance of the cell, and magnetic memory can be utilized to hold states representing intermediate values and, in so doing, store multiple bits per memory cell. New technologies are expected to be invented that will likewise be able to retain multiple bits per memory cell.

Figure 1:
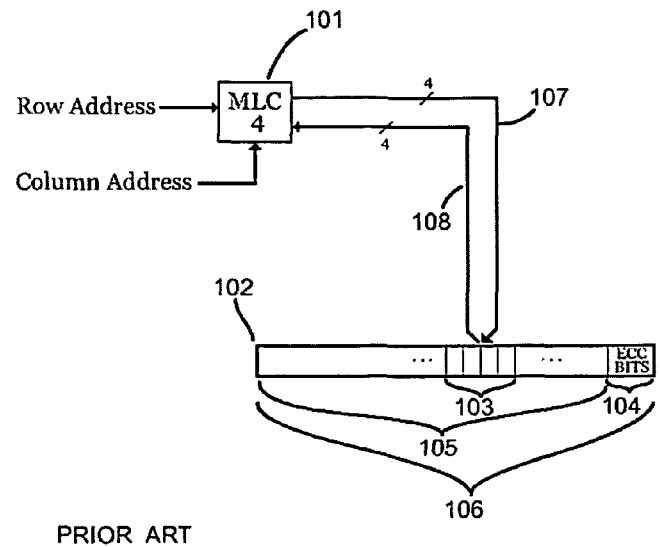
FIG. 1 illustrates a prior art four bit per cell memory transfer to a buffer for error correction.
Figure 2:
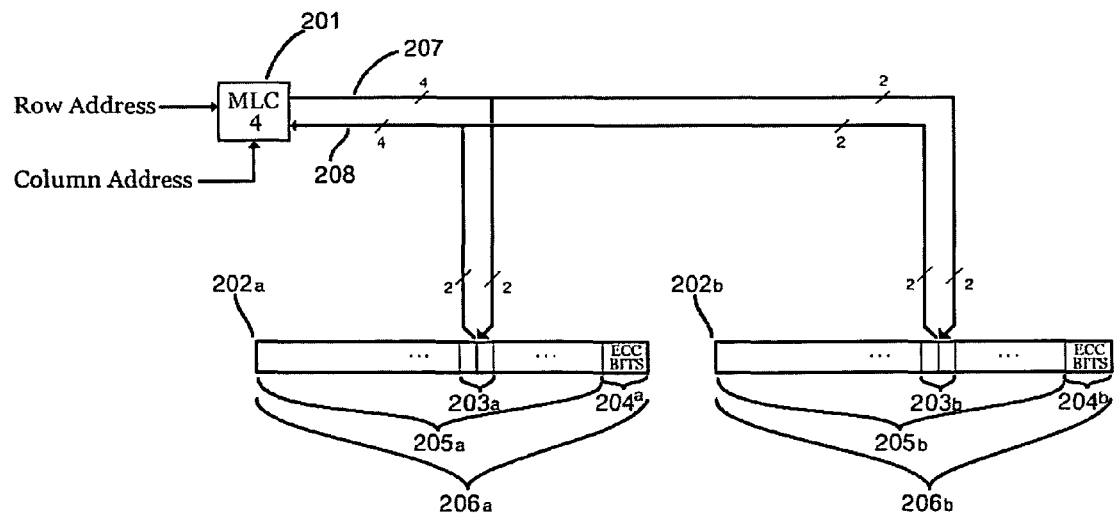
FIG. 2 illustrates a four bit per cell memory transfer to a buffer for error correction according to the present invention.

Using multi-level cell (MLC) flash memory having four bits per cell (MLC 4) as an example, referring to FIG. 1, when a memory location 101 is addressed, as many as four binary bits of information are accessed. In so much as the cell stores many potential levels of trapped charge corresponding to the set of possible states corresponding to the number of bits stored therein, the charge level must be accessed (when either reading or writing) in its full range and all of the bits stored or to be stored at that location must be read or written. A buffer 102 would be used to store these four bits 103 and others, including error correcting bits 104, to assemble an error correctable block 106. (Note that not shown in FIGS. 1 and 2 are the sense amplifiers to detect the state level stored in the memory element when reading along with the decoding logic to interpret which state out of the plurality of possible states is stored and to convert that state into a plurality of binary bits, where the number of bits in the plurality of bits is N if the number of possible states is $2^N$, because this is well understood by those skilled in the art of MLC memory cells. Likewise, the logic to access multiple levels in a 3-D memory array is not shown in FIG. 3 as this is well understood by those skilled in the art of 3-D memory design.)

Figure 3:
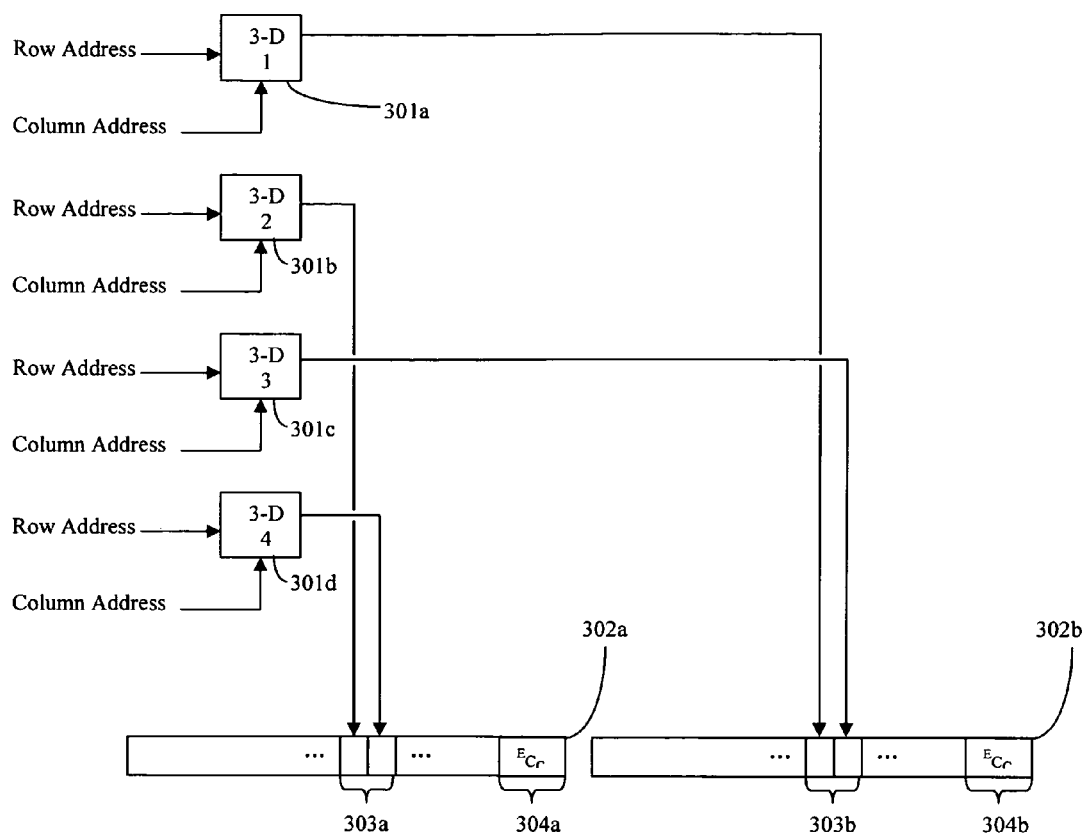
FIG. 3 illustrates a four layer, 3-D memory transfer to a buffer for error correction according to the present invention.
Figure 5:
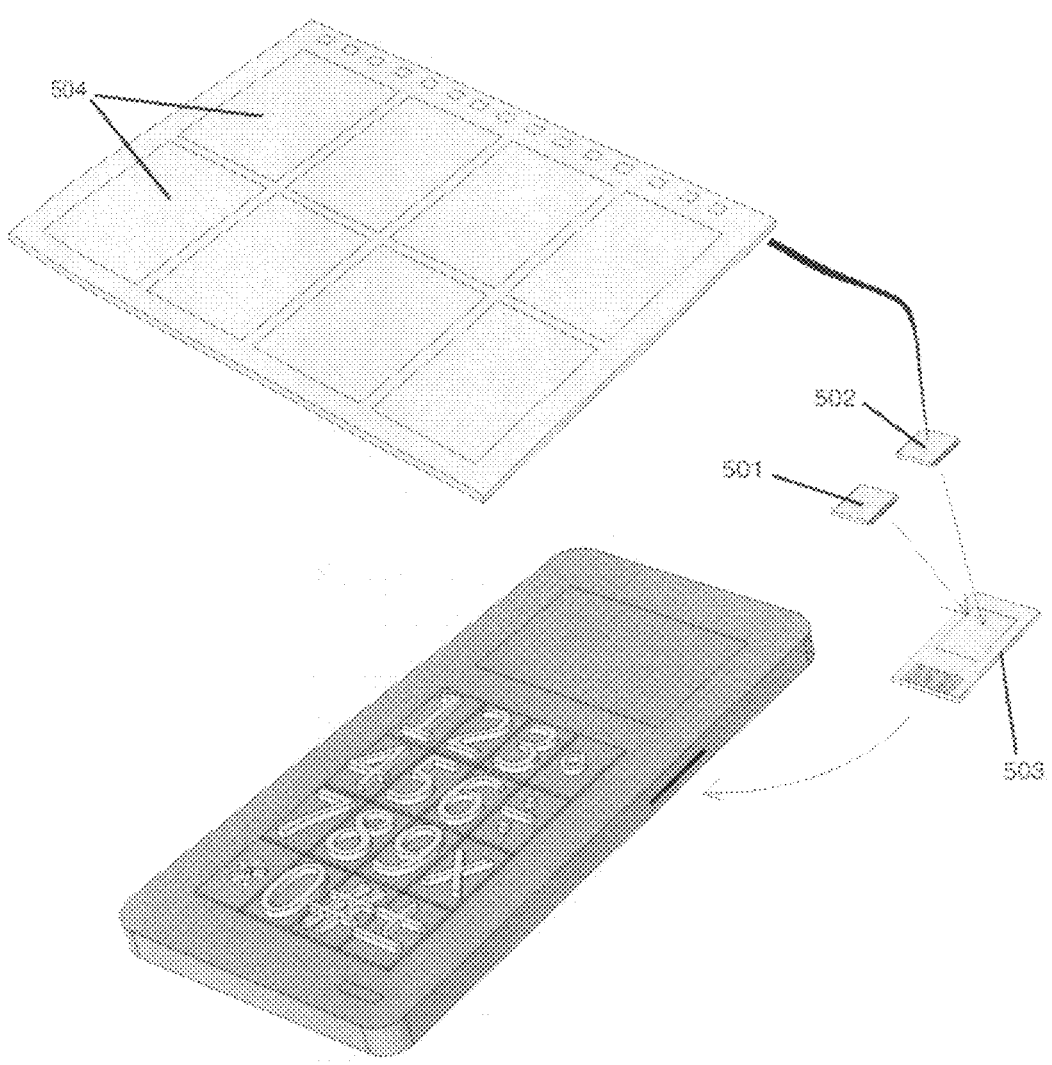
FIG. 5 depicts memory system.

However, if an error correction algorithm is employed that can only correct two bits per block of data, a defective MLC memory cell 101 would render the entire block uncorrectable with as many as four bad bits. It is an element of the present invention, as depicted in FIG. 2, that if the total data access were to be divided into multiple correctable segments or blocks 206a & 206b with each block in its own buffer 202a & 202b such that the bits 203a & 203b from a given multiple bit per cell memory element 201 that might be erroneous due to a given fault is divided across those multiple correctable blocks 206a & 206b such that this number of bits is less than or equal to the number of bits that can be corrected given the error correcting bits 204a & 204b and the error correcting algorithm employed (many such algorithms are well understood by those skilled in the art and the present invention is capable of being used with any appropriate error correcting algorithm known in the prior art). In the present example the four bits 203a & 203b corresponding to a given MLC memory cell 201 would be spread across a plurality of segments 206a & 206b of correctable data such that the number of data bits allocated to any given segment would fall below the limit of correctable bits (given the error correcting algorithm employed and the number of error correcting bits included). For example, with a MLC, four bits per cell memory device, if a given memory cell fails (either because it is a shorted out cell or an open cell, either of which could occur during manufacturing or could fail in the field), with the present invention, the lost bits will not all fall within the same error correcting block of data (i.e., the block of data bits with their corresponding error correcting bits). Likewise, as depicted in FIG. 3, if the plurality of bits accessed corresponds to a vertical, 3-D stacking of bits (301a, 301b, 301c & 301d) and a vertical connection is, for example, broken resulting in a open circuit at that row and column address, with the present invention, the lost bits again will not all fall within the same error correcting block of data, but rather the bits accessed 303a & 303b will be divided across two or more buffers 302a & 302b such that error correcting bits 304a & 304b, along with an error correcting algorithm, will correct the faulty bits. Also, as depicted in FIG. 5, if the plurality of bits accessed corresponds to one bit each from a plurality of tiles 504 where the same row and column address is used to access a bit within each tile, with the present invention, if that plurality of bits (perhaps, due to a fault in the address decoder logic shared by all tiles) the lost bits again will not fall within the same error correcting block of data. It is contemplated by the present invention that the use of a buffer can be a physical hardware logic device or circuit or, through the use of programmed firmware or software, could be a virtual buffer device.

Figure 4:
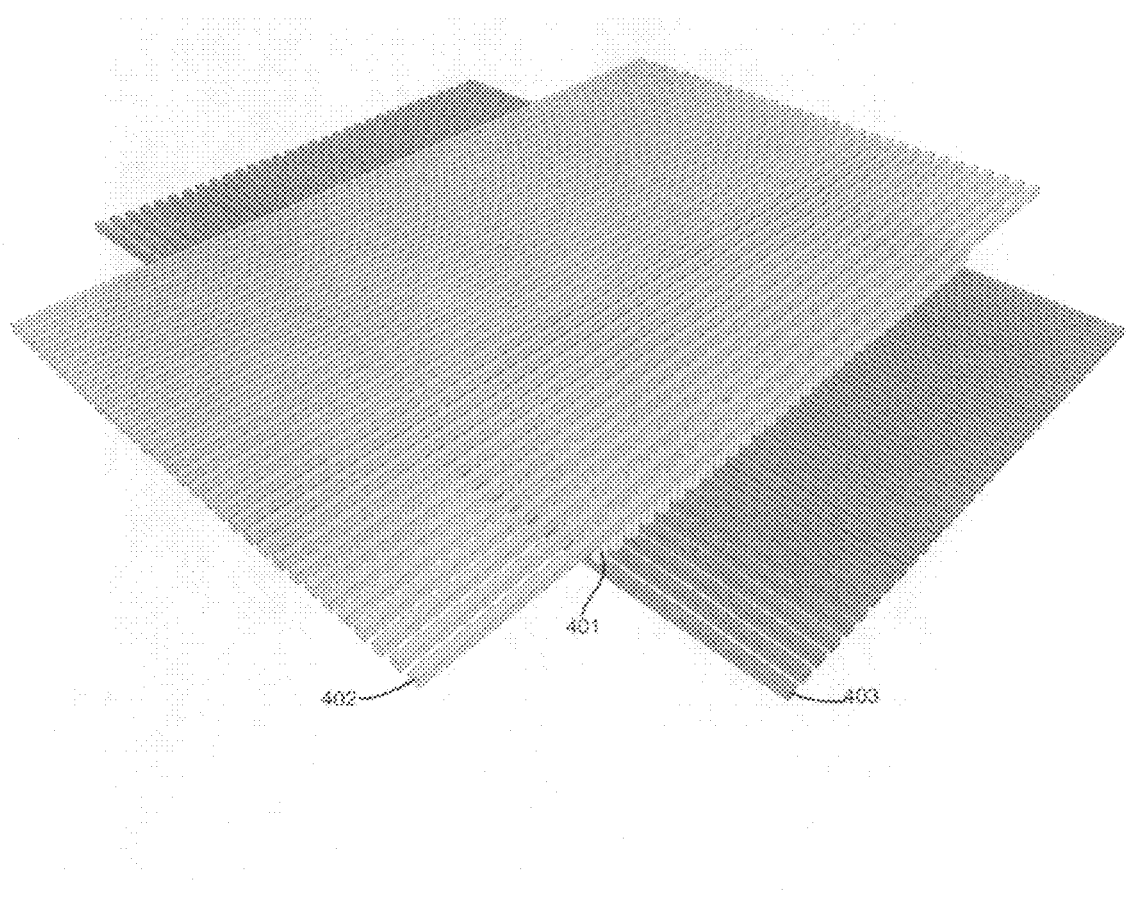
FIG. 4 depicts a representation of a physical memory.

In typical operation of a memory device, the address bits can be divided into functional bit groupings. For example, some address bits may be row addressing bits and some may be column addressing bits for an array (or sub-array or tile or sub-tile) within the array. Often, internal timing and logic associated with decoding an address to select a given column and row has a significant impact on the performance of a device and, if an MLC memory cell 401 is located at the intersection of the selected row 402 and column 403 (as depicted in FIG. 4) or if the memory array comprises a plurality of layers of memory bits (e.g., a 3-D memory array), it is most efficient from an array access time point of view to access all of the bits corresponding to that selected row and column together (thereby avoiding having to re-access the intersection of that row and column at a different point in time to access those bits not accessed when the row and column was first decoded). It is an element of the present invention to employ this access efficiency, but to then not to keep all of the bits accessed at that intersection location together in the same segment for error correcting purposes. While it is an element of the present invention to enable only a single segment to be accessed (i.e., to access a subset of the bits stored at a given intersection), it is recognized that typically multiple segments will be accessed as a part of a single, larger data access thereby benefiting from the present invention. As depicted in FIG. 2 (for a four bit per cell MLC memory cell device) and in FIG. 3 (for a four level 3-D, stacked or layered memory device), the four bits corresponding to a given MLC or 3-D memory cell would be spread across a plurality of segments of correctable data such that the number of data bits allocated to any given segment would fall below the limit of correctable bits (given the error correcting algorithm employed and the number of error correcting bits included).

The burden of performing this error correction will fall onto a companion memory controller device, a companion processor, or the logic of the memory chip itself as is well understood by those skilled in the art. This could take the form of multiple buffers in the memory chip that can be loaded with the data to be read or written (including the error correcting bits for each correctable sector within the total block) where each buffer could hold a given sector along with its error correcting bits. In this way, each sector could have the ECC algorithm performed (either within the memory chip utilizing that chip's logic or by a companion processor or controller that can access the buffers one or more at a time) on a sector by sector basis while reading and writing out of and into the memory array of however many dimensions can be performed in a way that is most efficient for the memory architecture.

An alternative access mechanism would be to stream all of the data between a companion device such as a controller and the memory chip such that separating the data into multiple separate segments for error correcting would be handled by that companion device (again, either in actual hardware buffers or virtual buffers implemented in software or firmware). In a software implementation, bits would be grouped as if in their own hardware buffer and such a grouping of a plurality of bits would be a virtual buffer.

Put another way, the present invention is a means and method to divide any addressable plurality of bits into separate groupings such that the number of bits from any addressable plurality of bits that are included in any grouping can not result in more bad bits than the error correcting algorithm employed upon that grouping can correct (if all the bits from any one such addressable plurality were to be bad due to a failure of the addressable plurality). Examples of an addressable plurality include (i) the bits stored in a MLC memory element, (ii) the bits stacked at and above an addressable location in a 3-D memory array, (iii) the bits of memory comprised by a NAND Flash chain of bits (as implemented in a NAND flash series of bits as is well understood by those skilled in the art of NAND Flash memory design), or (iv) any collection of bits that would be addressed together either as a function of the physical design or layout of a given memory device or as a function of any operational approach for the purpose of enhancing access performance. In this last case, an example would be a memory device that is divided into a plurality of tiles 504 where the speed of access is maximized by applying the same address to every tile simultaneously to access a bit at the same location within each tile and where the number of tiles is greater than the number of bits that can be corrected by the error correcting algorithm; in this case, the bits accessed at a single address would be separated into a plurality of correctable groups. Not only could this grouping be performed by the logic within the memory chip, but the grouping and error correcting could be performed by a memory system 503 comprising a controller 501 and a memory chip 502 whereby bits obtained from a given memory element at a given address or dimension in the memory chip.

The foregoing description of an example of the preferred embodiment of the invention and the variations thereon have been presented for the purposes of illustration and description. It is not intended to be exhaustive or to limit the invention to the precise forms disclosed. Many modifications and variations are possible in light of the above teaching. It is intended that the scope of the invention be limited not by this detailed description.

I claim:

1. A method for accessing a memory array comprising:
grouping bits for error correction such that (i) bits obtained by accessing a multiple bit-per-cell memory element having at least two bits at a row address and a column address are divided across two groupings and (ii) fewer bits from the multiple bit-per-cell memory element are included in any grouping able to be corrected using an error-correcting algorithm;
receiving a data-access request to access a first bit in the multiple bit-per-cell memory element, the first bit belonging to a first grouping;
accessing all of the bits in the multiple bit-per-cell memory element, wherein a second bit in the multiple bit-per-cell memory element belongs to a second grouping different from the first grouping; and
storing the first and second bits in at least one buffers, thereby avoiding having to re-access the row address and column address at a later point in time to access the second bits.

2. The method of claim 1 whereby said grouping is performed in the controller.

3. The method of claim 1 whereby said grouping is performed in the memory chip.

4. The method of claim 1 whereby the buffer is implemented in hardware.

5. The method of claim 1 whereby the buffer is a virtual buffer implemented in software.

6. The method of claim 1 whereby the multiple bit-per-cell memory element comprises bits in a 3-D stack.

7. A memory device whereby bits are grouped for error correction such that (i) bits obtained by accessing a multiple bit-per-cell memory element having at least two bits at a row address and a column address are divided across two groupings and (ii) fewer bits from the multiple bit-per-cell memory element are included in any grouping able to be corrected using an error-correcting algorithm, wherein the memory device comprises a plurality of buffers and wherein, in response to a data-access request to access a first bit belonging to a first grouping in the multiple bit-per-cell memory element, wherein all of the plurality of bits in the multiple bit-per-cell memory element are accessed, the first bit in the plurality of bits corresponding to the first grouping and a second bit in the plurality of bits corresponding to a second grouping different from the first grouping, and stored in the buffers such that each buffer stores bits corresponding to different groupings, thereby avoiding having to re-access the row address and column address at a later point in time to access the second.

8. The device of claim 7 whereby said grouping is performed in the controller.

9. The device of claim 7 whereby said grouping is performed in the memory chip.

10. The device of claim 7 whereby the buffers are is implemented in hardware.

11. The device of claim 7 whereby the buffers are is virtual buffers implemented in software.

12. The device of claim 7 whereby the multiple bit-per-cell memory element comprises bits in a 3-D stack.

13. A memory system comprising a controller and a memory chip whereby bits obtained by addressing a multiple bit-per-cell memory element at a row address and a column address and comprising an addressable plurality of bits are grouped such that fewer bits are included in a group from a given element than can be corrected given an error correction algorithm, wherein the memory device comprises a plurality of buffers and wherein, in response to a data-access request to access a first bit in the plurality of bits belonging to a first grouping in the multiple bit-per-cell memory element, all of the bits in the multiple bit-per-cell memory element are accessed, the first bit corresponding to the first grouping and a second bit in the plurality of bits corresponding to a second grouping different from the first grouping and stored in the buffers such that each buffer stores bits corresponding to different groupings, thereby avoiding having to re-access the row address and column address at a later point in time to access the second bits.

14. The system of claim 13 whereby said grouping is performed in the controller.

15. The system of claim 13 whereby said grouping is performed in the memory chip.

16. The system of claim 13 whereby the buffers are is implemented in hardware.

17. The system of claim 13 whereby the buffers are is virtual buffers implemented in software.

18. The system of claim 13 whereby the multiple bit-per-cell memory element comprises bits in a 3-D stack.

* * * * *

UNITED STATES PATENT AND TRADEMARK OFFICE
CERTIFICATE OF CORRECTION

PATENT NO. : 9,195,540 B2  
APPLICATION NO. : 13/200909  
DATED : November 24, 2015  
INVENTOR(S) : Daniel R. Shepard Page 1 of 1

It is certified that error appears in the above-identified patent and that said Letters Patent is hereby corrected as shown below:

In the Claims:

Column 6, Claim 1, Line 11, please delete "buffers" and insert --buffer-- therefor;

Column 6, Claim 1, Line 14, please delete "bits" and insert --bit-- therefor;

Column 6, Claim 7, Line 38, please delete "in" and insert --of-- therefor;

Column 6, Claim 7, Line 43, please insert --bits-- after second;

Column 6, Claim 10, Line 48, please delete "is";

Column 6, Claim 11, Line 50, please delete "is";

Column 7, Claim 16, Line 9, please delete "is";

Column 7, Claim 17, Line 11, please delete "is".

Signed and Sealed this  
Twenty-third Day of February, 2016

Michelle K. Lee  
*Director of the United States Patent and Trademark Office*